(12) United States Patent
Lin et al.

(10) Patent No.: US 11,394,937 B1
(45) Date of Patent: Jul. 19, 2022

(54) PROJECTION DEVICE

(71) Applicant: Coretronic Corporation, Hsin-Chu (TW)

(72) Inventors: Chun-Ting Lin, Hsin-Chu (TW); Wen-Yen Chung, Hsin-Chu (TW); Tung-Chou Hu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 16 days.

(21) Appl. No.: 17/178,245

(22) Filed: Feb. 18, 2021

(51) Int. Cl.
  *H04N 9/31* (2006.01)
  *G03B 21/14* (2006.01)
  *H05K 7/20* (2006.01)
  *G03B 21/16* (2006.01)

(52) U.S. Cl.
  CPC ......... *H04N 9/3144* (2013.01); *G03B 21/145* (2013.01); *G03B 21/16* (2013.01); *H05K 7/20181* (2013.01); *H05K 7/20336* (2013.01)

(58) Field of Classification Search
  CPC .. G03B 21/145; G03B 21/16; H05K 7/20181; H05K 7/20336

USPC .......................................................... 353/52
See application file for complete search history.

(56) References Cited

FOREIGN PATENT DOCUMENTS

| CN | 101498887 | 8/2009 |
|----|-----------|--------|
| CN | 208752380 | 4/2019 |
| TW | I417635 | 12/2013 |

*Primary Examiner* — Jerry L Brooks
(74) *Attorney, Agent, or Firm* — JCIPRNET

(57) ABSTRACT

A projection device includes a housing, a projection lens, a first light source module, a second light source module, a first heat dissipation module and a second heat dissipation module. The housing includes a front cover, a rear cover, a first side cover, a second side cover, a first air inlet, a second air inlet and an air outlet. The front cover, the rear cover, the first side cover and the second side cover define an accommodation space. A direction of an optical axis of the projection lens divides the accommodation space into a first area and a second area. The second air inlet is located at the first area, and the air outlet is located at the second area. The first heat dissipation module is connected to the first light source module, and the second heat dissipation module is connected to the second light source module.

20 Claims, 7 Drawing Sheets

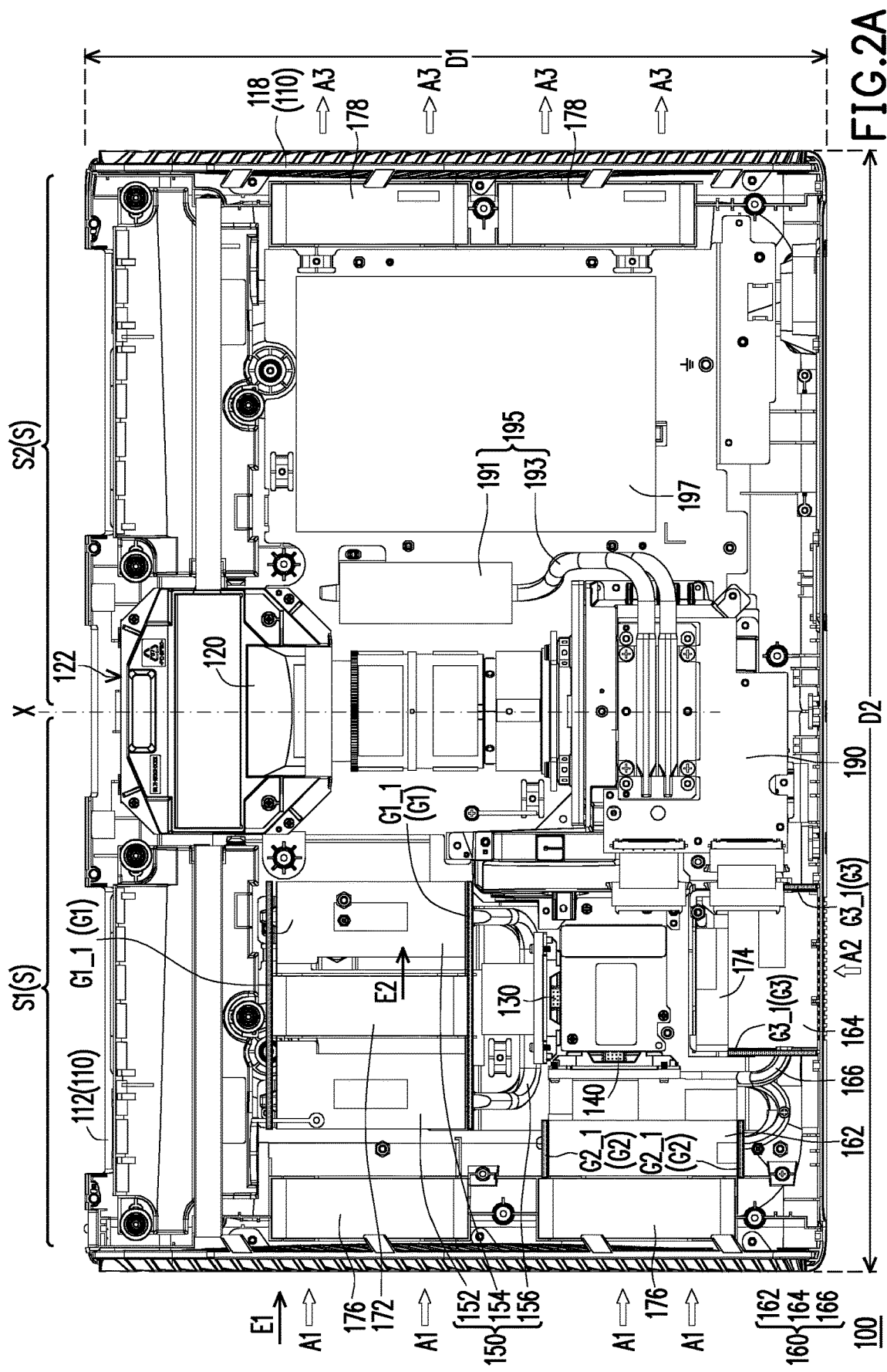

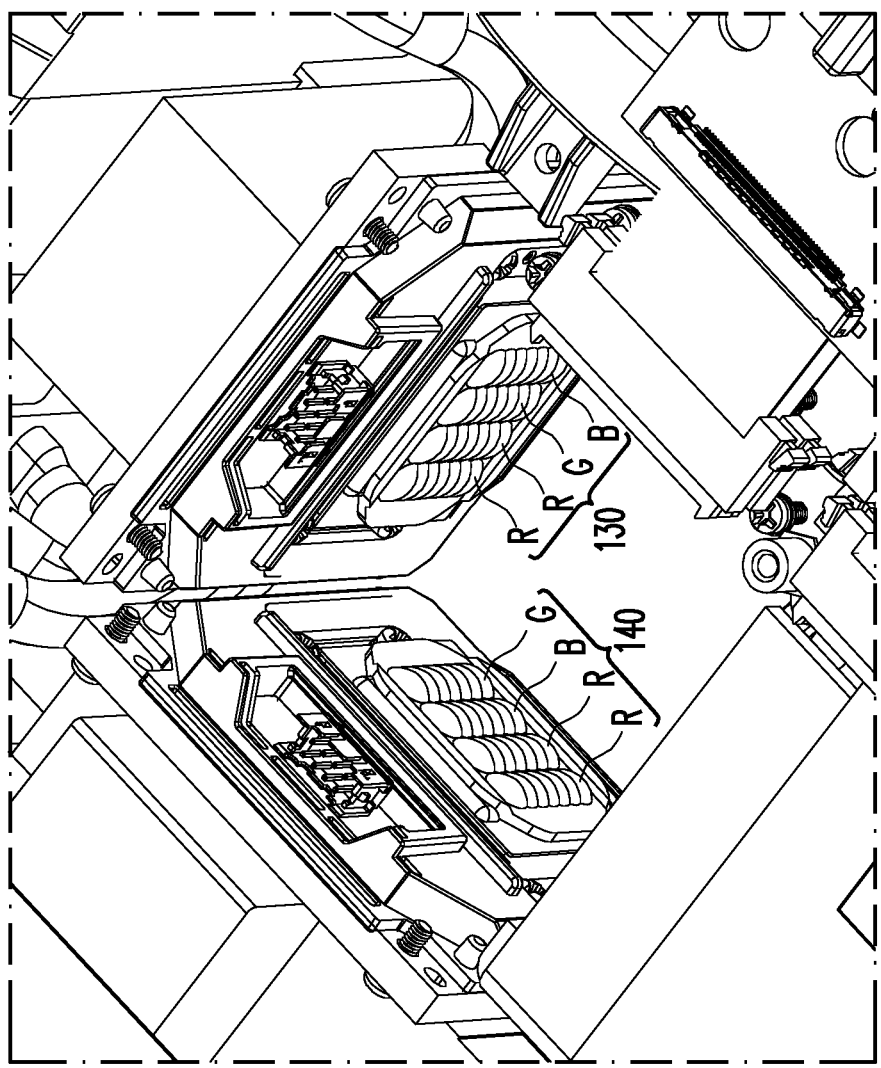

PROJECTION DEVICE

BACKGROUND

Technical Field

The disclosure relates to an optical device, and in particular, to a projection device.

Description of Related Art

In response to the appearance requirements of the ultra-short focal projector and to prevent users seeing the internal mechanism of the projector from the direction of the projection screen of the front cover, the ribs of the air outlet or/and air inlet are designed to be inclined toward the rear cover to form a hidden internal arrangement design. The rear cover of the ultra-short focal projector is equipped with an air inlet, and the hot air generated inside the projector will move toward the rear cover due to the design of the hidden air outlet. However, ultra-short focal projectors are usually placed adjacent to the wall, so hot air flows into the air inlet of the rear cover after hitting the wall, causing the hot air to flow back. The hot air recirculation will increase the temperature of the internal components of the projector, which cannot effectively solve the heat dissipation problem of the internal heating components.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention provides a projection device that exhibits improved heat dissipation effect.

Other purposes and advantages of the embodiments of the invention may be further understood according to the technical features disclosed herein.

To achieve one, part, or all of the foregoing purposes or other purposes, an embodiment of the invention provides a projection device including a housing, a projection lens, a first light source module, a second light source module, a first heat dissipation module and a second heat dissipation module. The housing includes a front cover, a rear cover, a first side cover, a second side cover, a first air inlet, a second air inlet and an air outlet. The front cover and the rear cover are opposite to each other, the first side cover and the second side cover are opposite to each other and connect the front cover and the rear cover, and the front cover, the rear cover, the first side cover and the second side cover define an accommodation space. The projection lens is disposed in the housing, and a direction of an optical axis of the projection lens divides the accommodation space into a first area and a second area. A light emitting side of the projection lens is located on the front cover, the first air inlet is disposed on the first side cover and located at the first area, the second air inlet is disposed on the rear cover and located at the first area, and the air outlet is disposed on the second side cover and located at the second area. The first light source module, the second light source module, the first heat dissipation module and the second heat dissipation module are located in the first area of the accommodation space. The first heat dissipation module is connected to the first light source module to dissipate heat generated by the first light source module, and the second heat dissipation module is connected to the second light source module to dissipate heat generated by the second light source module.

Based on the foregoing, embodiments of the invention are characterized with at least one of the following advantages or effects. In the design of the projection device of the invention, the direction of the optical axis of the projection lens divides the accommodation space of the housing into the first area and the second area. The first light source module, the second light source module, the first heat dissipation module and the second heat dissipation module are located in the first area, and the first air inlet disposed at the first side cover and the second air inlet disposed at the rear cover are located at the first area, and the air outlet is located at the second area. This is, the first light source module and the second light source module are adjacent to the first air inlet and the second air inlet, and the air outlet is far away from the first light source module and the second light source module, so that the heat dissipation effect of the first light source module is substantially similar to the heat dissipation effect of the second light source module. In addition, the second air inlet and the air outlet are respectively located on both side of the optical axis to prevent hot air from flowing back. In short, the projection device of the present invention can have a better heat dissipation effect.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A is a top schematic diagram illustrating the projection device of FIG. 1 omitting the shielding plate and the air guiding plate.

FIG. 6 is a three-dimensional diagram illustrating the first light source module and the second light source module of the projection device of FIG. 2A.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
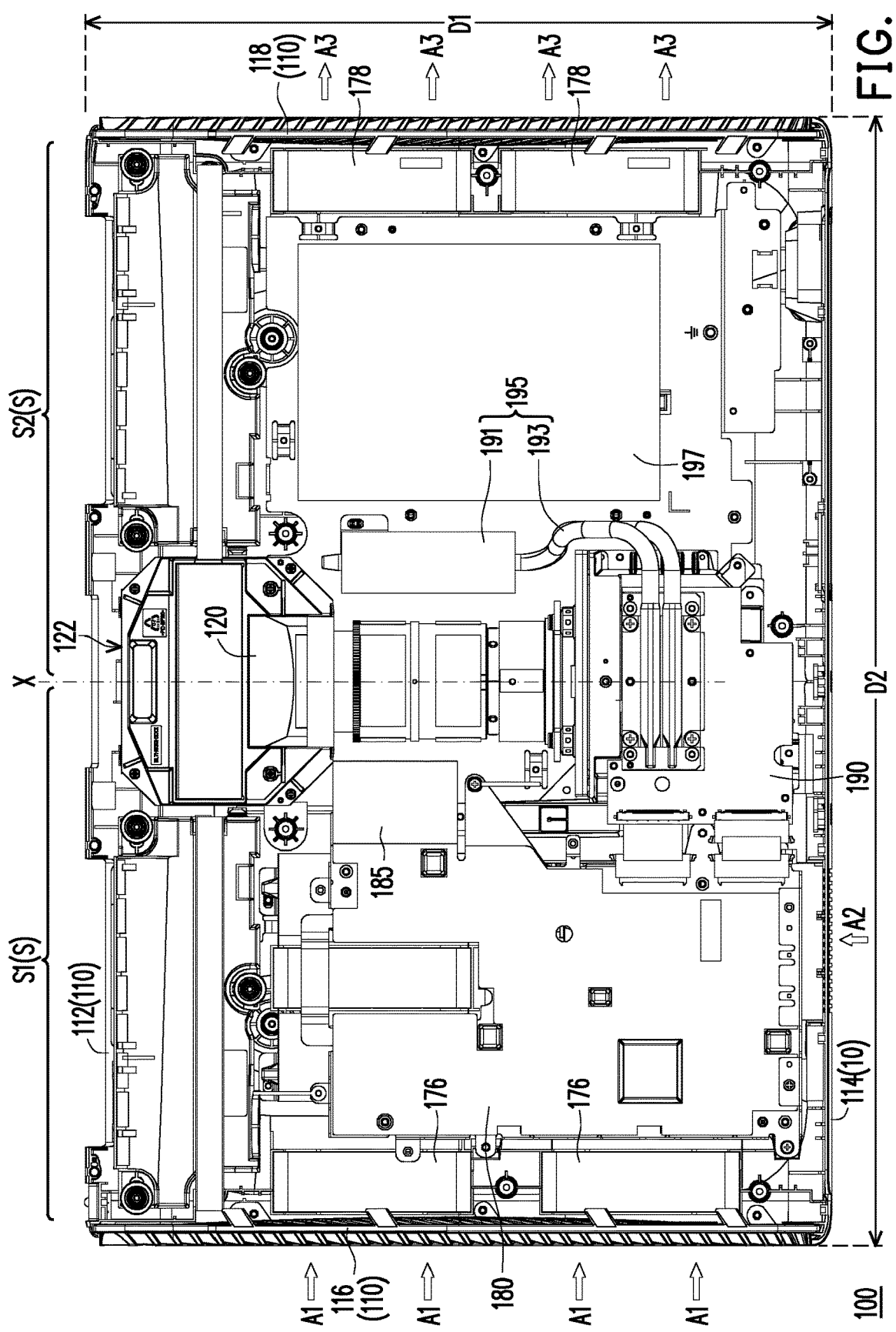
FIG. 1 is a top schematic diagram illustrating a projection device according to an embodiment of the invention.
Figure 2B:
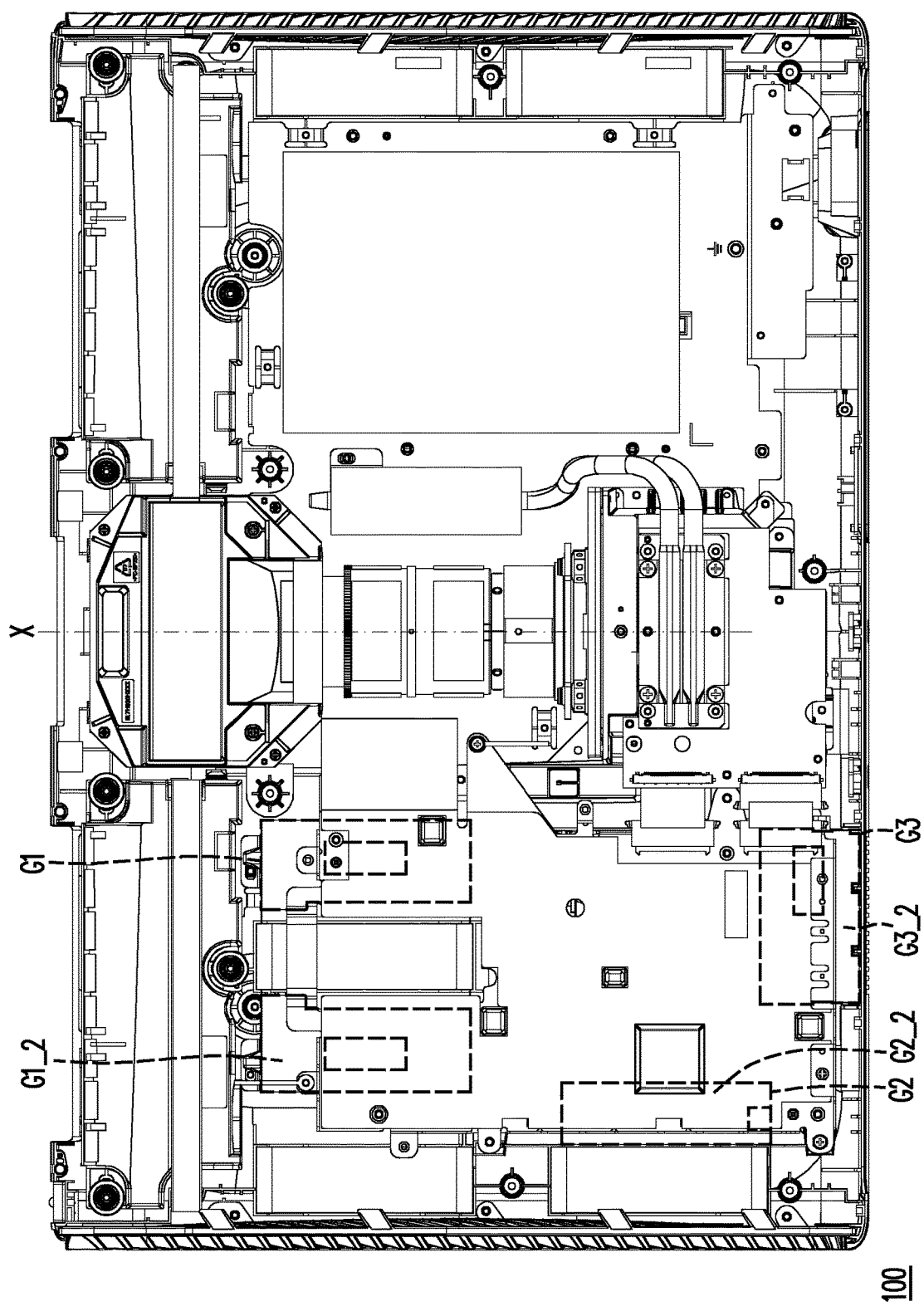
FIG. 2B is a top schematic diagram illustrating the projection device of FIG. 1 with the shielding plate and the air guiding plate FIG. 3 a three-dimensional diagram illustrating the projection device of FIG. 1 from a viewing angle.
Figure 3:
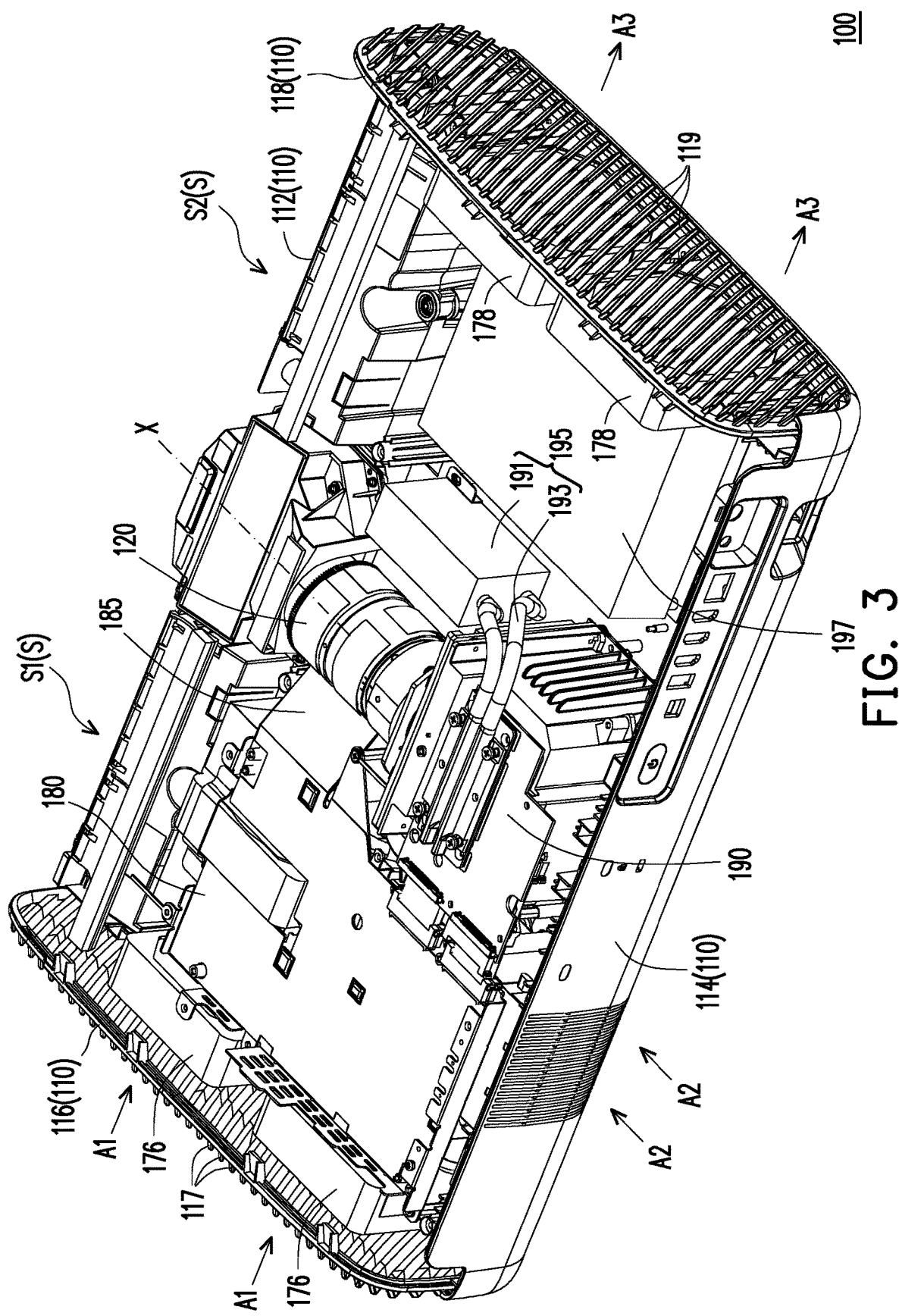
Figure 4:
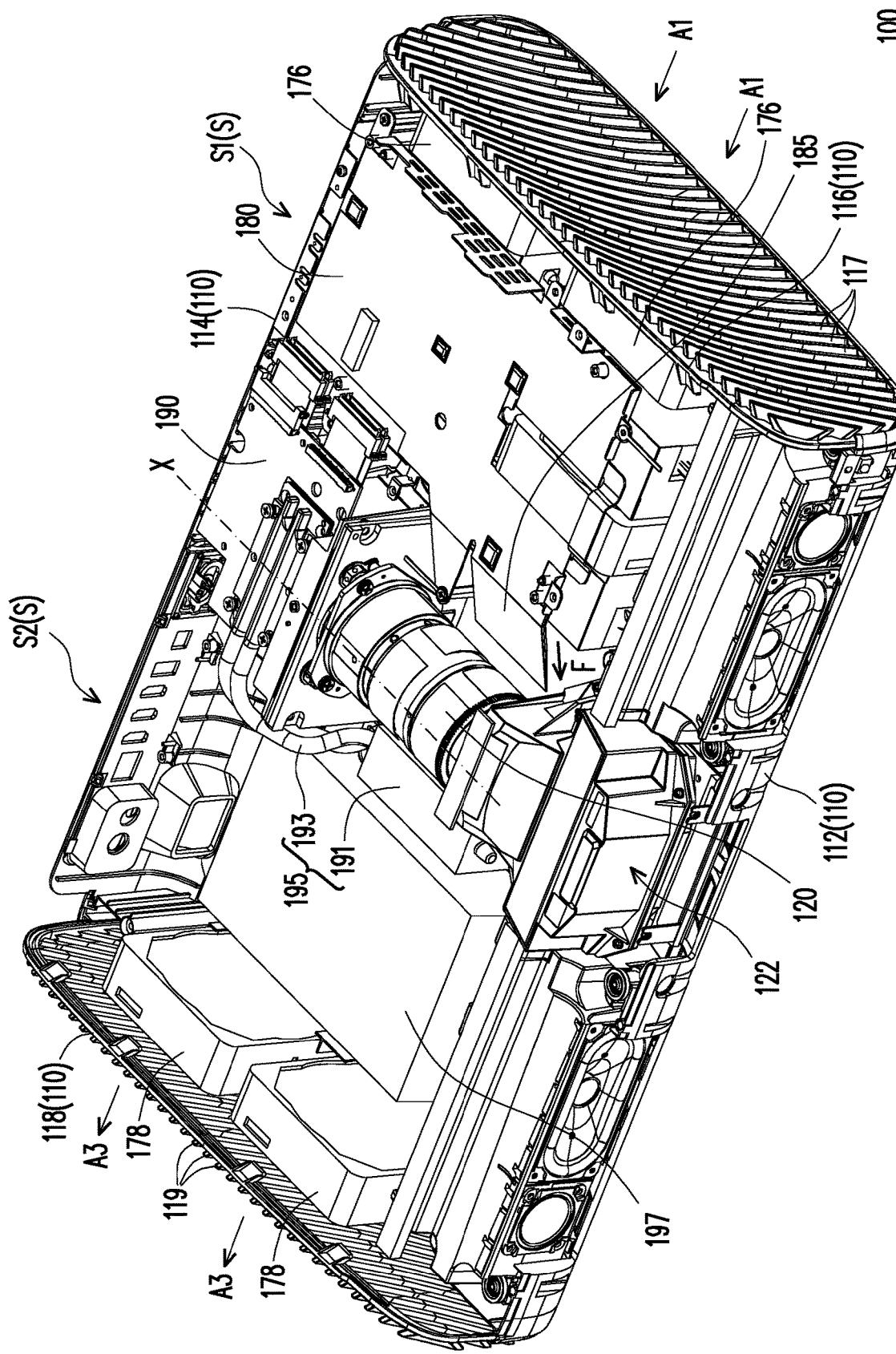
FIG. 4 a three-dimensional diagram illustrating the projection device of FIG. 1 from another viewing angle.
Figure 5:
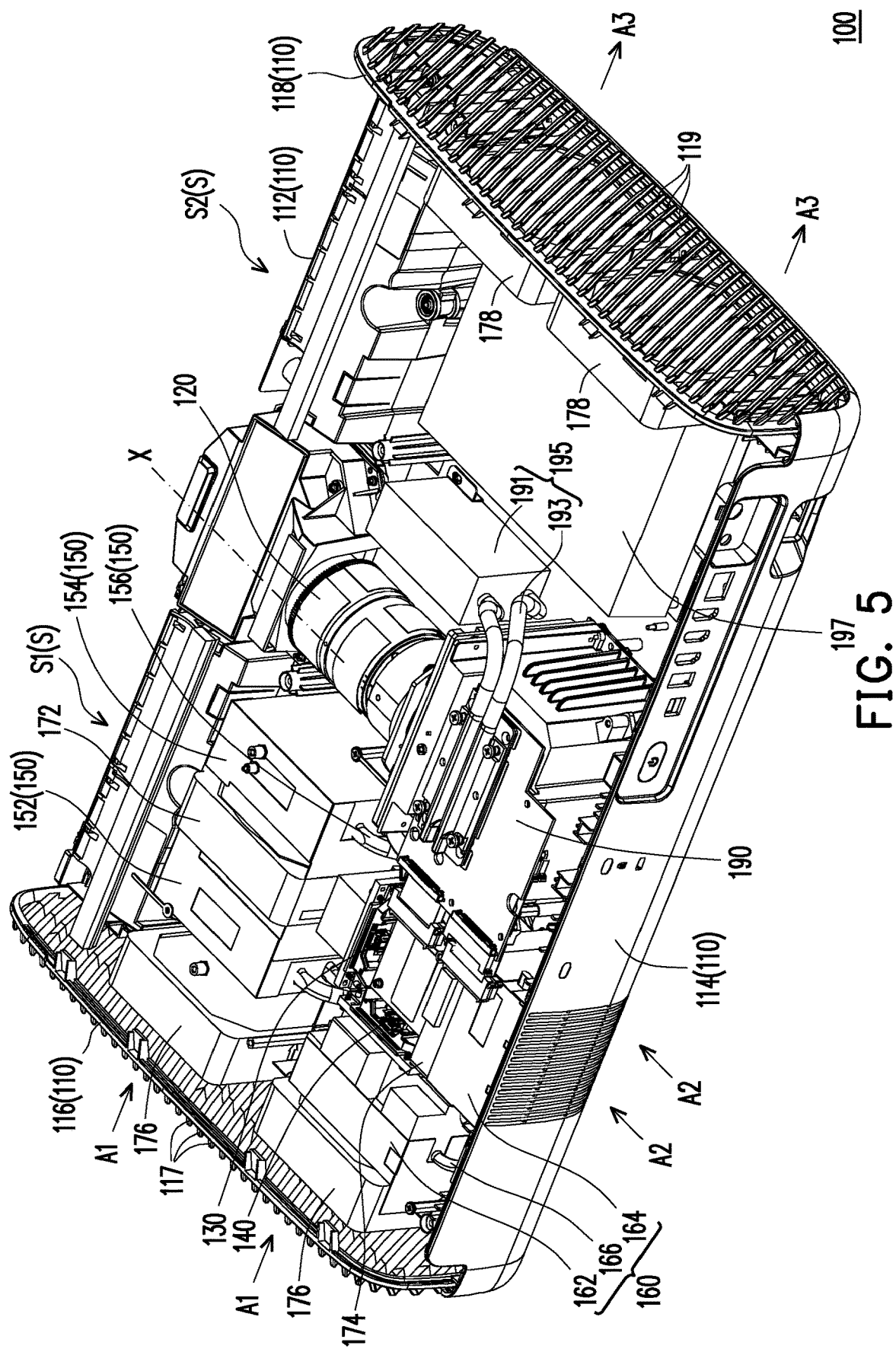
FIG. 5 a three-dimensional diagram illustrating the projection device of FIG. 2A from a viewing angle.

FIG. 1 is a top schematic diagram illustrating a projection device according to an embodiment of the invention. FIG. 2A is a top schematic diagram illustrating the projection device of FIG. 1 omitting the shielding plate and the air guiding plate. FIG. 2B is a top schematic diagram illustrating the projection device of FIG. 1 with the shielding plate and the air guiding plate. FIG. 3 a three-dimensional diagram illustrating the projection device of FIG. 1 from a viewing angle. FIG. 4 a three-dimensional diagram illustrating the projection device of FIG. 1 from another viewing angle. FIG. 5 a three-dimensional diagram illustrating the projection device of FIG. 2A from a viewing angle. FIG. 6 is a three-dimensional diagram illustrating the first light source module and the second light source module of the projection device of FIG. 2A. For convenience of description, FIG. 5 omits the illustration of the first air guider, the second air guider and the third air guider.

First, referring to FIG. 1, FIG. 2A, and FIG. 5, in the embodiment, a projection device 100 includes a housing 110, a projection lens 120, a first light source module 130, a second light source module 140, a first heat dissipation module 150 and a second heat dissipation module 160. The housing 110 includes a front cover 112, a rear cover 114, a first side cover 116, a second side cover 118, a first air inlet A1, a second air inlet A2 and an air outlet A3. The front cover 112 and the rear cover 114 are opposite to each other, the first side cover 116 and the second side cover 118 are opposite to each other and connect the front cover 112 and the rear cover 114, and the front cover 112, the rear cover 114, the first side cover 116 and the second side cover 118 define an accommodation space S. The projection lens 120 is disposed in the housing 110 and projects an image light (not shown) outside the housing 110, and a direction of an optical axis X of the projection lens 120 divides the accommodation space S into a first area S1 and a second area S2. A light emitting side 122 of the projection lens 120 is located on the front cover 112. The first air inlet A1 is disposed on the first side cover 116 and located at the first area S1, the second air inlet A2 is disposed on the rear cover 114 and located at the first area S1, and the air outlet A3 is disposed on the second side cover 118 and located at the second area S2. The first light source module 130, the second light source module 140, the first heat dissipation module 150 and the second heat dissipation module 160 are located in the first area S1 of the accommodation space S. The first heat dissipation module 150 is connected to the first light source module 130 to dissipate heat generated by the first light source module 130. The second heat dissipation module 160 is connected to the second light source module 140 to dissipate heat generated by the second light source module 140.

Specifically, referring to FIG. 3, FIG. 4, and FIG. 5, the first side cover 116 of the embodiment further includes a plurality of ribs 117, and the respective rib 117 disposed on the first side cover 116 is inclined respect to the first side cover 116. The second side cover 118 of the embodiment further includes a plurality of ribs 119, and the respective rib 119 disposed on the second side cover 118 is inclined respect to the second side cover 118 for guiding an airflow outputting from the air outlet A3 to the rear cover 114 (ex. rear side). In other words, the inclined direction of the ribs 119 at the air outlet A3 does not allow the hot air to flow back into the housing 110. In addition, the inclined way of the ribs 117, 119 also prevent users seeing the internal mechanism of the housing 110, which can be regarded as a hidden opening.

As shown in FIG. 1 and FIG. 2, a distance D2 between the first side cover 116 and the second side cover 118 is greater than a distance D1 between the front cover 112 and the rear cover 114. The projection lens 120 herein is an ultra-short focal reflective projection lens. The projection lens 120 of the embodiment is located in the middle of the housing 110. Moreover, the optical axis X of the projection lens 120 is located in the middle of the housing 110, and an area range of the first area S1 is equal to an area range of the second area S2. In other embodiment, the optical axis X of the projection lens 120 is located close to the first side cover or second side cover, such that an area range of the first area S1 is not equal to an area range of the second area S2. The invention is not limited to the embodiment described and other embodiments can also be used to practice the invention.

Referring to FIG. 2A, FIG. 2B, FIG. 5, and FIG. 6, the first light source module 130 is connected to the first heat dissipation module 150, and the second light source module 140 is connected to the second heat dissipation module 160. Herein, each of the first light source module 130 and the second light source module 140 includes at least one red light emitting diode R, at least one green light emitting diode G and at least one blue light emitting diode B. Preferably, a duty cycle of the first light source module 130 is the same as a duty cycle of the second light source module 140.

Furthermore, referring to FIG. 2A, FIG. 2B and FIG. 5 again, the first heat dissipation module 150 includes a first heat dissipation fin assembly 152, a second heat dissipation fin assembly 154 and a heat pipe 156 connecting the first heat dissipation fin assembly 152 and the second heat dissipation fin assembly 154, and the first light source module 130 is connected to the heat pipe 156. Furthermore, the first light source module 130 is directly and thermally connected to the heat pipe 156 of the first heat dissipation module 150. Or the first light source module 130 is thermally connected to a heat conducting plate (not numbered) and the heat conducting plate is thermally connected to the heat pipe 156 of the first heat dissipation module 150. Preferably, each fin of the first heat dissipation fin assembly 152 and each fin of second heat dissipation fin assembly 154 are respectively perpendicular to the optical axis X of the projection lens 120 in order to improve the heat dissipation effect. Herein, the first heat dissipation fin assembly 152, the second heat dissipation fin assembly 154 and the heat pipe 156 of the first heat dissipation module 150 are arranged in a U shape.

The projection device 100 of the embodiment further includes a system fan 172 disposed between the first heat dissipation fin assembly 152 and the second heat dissipation fin assembly 154, wherein an air outlet direction E2 at the system fan 172 is parallel to an air inlet direction E1 at the first air inlet A1. In addition, the projection device 100 of the embodiment further includes a first air guider G1 covered on the first heat dissipation module 150. The first air guider G1 includes two side walls G1_1 and a top wall G1_2 connected between the two side walls G1_1. The two side walls G1_1 are respectively disposed on opposite sides of the first heat dissipation module 150 along a direction perpendicular to the optical axis X. Particularly, the two side walls G1_1 of the first air guider G1 are respectively located at two opposite end of the first heat dissipation fin assembly 152 and are respectively located at two opposite end of the second heat dissipation fin assembly 154, such that an airflow F (shown in FIG. 4) entering from the first air inlet A1 is guided between the two side walls G1_1 and sequentially passes through the first heat dissipation fin assembly 152, the system fan 172 and the second heat dissipation fin assembly 154.

Similarly, the second heat dissipation module 160 of the embodiment includes a third heat dissipation fin assembly 162, a forth heat dissipation fin assembly 164 and a heat pipe 166. Two opposite ends of the heat pipe 166 respectively connect the third heat dissipation fin assembly 162 and the forth heat dissipation fin assembly 164. The second light source module 140 is connected to the heat pipe 166. Furthermore, the second light source module 140 is directly and thermally connected to the heat pipe 166 of the second heat dissipation module 160. Or the second light source module 140 is thermally connected to a heat conducting plate (not numbered) and the heat conducting plate is thermally connected to the heat pipe 166 of the second heat dissipation module 160. The third heat dissipation fin assembly 162 is located between the first air inlet A1 and the second light source module 140, and the forth heat dissipation fin assembly 164 is disposed near the second air inlet A2.

The projection device 100 of the embodiment further includes a system fan 174 disposed near the second air inlet A2, wherein the forth heat dissipation fin assembly 164 is located between the system fan 174 and the second air inlet A2. In addition, the projection device 100 further includes a second air guider G2 covered on the third heat dissipation fin assembly 162 and a third air guider G3 covered on the forth heat dissipation fin assembly 164. The second air guiders G2 includes two side walls G2_1 and a top wall G2_2 connected between the two side walls G2_1. The two side walls G2_1 are respectively disposed on opposite sides of the third heat dissipation fin assembly 162 along a direction perpendicular to the optical axis X. The third air guider G3 includes two side walls G3_1 and a top wall G3_2 connected between the two side walls G3_1. The two side walls G3_1 are respectively disposed on opposite sides of the forth heat dissipation fin assembly 164 along a direction parallel to the optical axis X.

Moreover, referring to FIG. 1, FIG. 2A, FIG. 2B, FIG. 3 and FIG. 4 again, the projection device 100 of the embodiment further includes a shielding plate 180 and an air guiding plate 185. The shielding plate 180 is disposed in the housing 110 and located in the first area S1, wherein the shielding plate 180 covers the first light source module 130, the second light source module 140, the first heat dissipation module 150 and the second heat dissipation module 160. The air guiding plate 185 is fixed on the shielding plate 180 and extending from the shielding plate 180 to the projection lens 120, wherein the air guiding plate 185 is located between the first heat dissipation module 150 and the projection lens 120 to guide the airflow F passing through the first heat dissipation module 150 to flow under the projection lens 120 to prevent the projection lens 120 from being affected by hot air. Moreover, the first air guider G1, the second air guider G2, and the third air guider G3 are disposed under the shielding plate 180. The top wall G1_2 of the first air guider G1, the top wall G2_2 of the second air guider G2, and the top wall G3_2 of the third air guider G3 are parallel to the shielding plate 180.

Furthermore, the projection device 100 further includes an optical engine module 190 and a third heat dissipation module 195. The optical engine module 190 and the third heat dissipation module 195 are disposed in the housing 110 and the optical engine module 190 is connected to the projection lens 120, wherein the optical engine module 190 is located between the projection lens 120 and the rear cover 114 of the housing 110. Herein, the optical engine module 190 includes a digital micromirror device (DMD) (not numbered). The third heat dissipation module 195 is located in the second area S2, wherein the third heat dissipation module 195 includes a heat dissipation fin assembly 191 and a heat pipe 193 connected to the optical engine module 190 to dissipate heat generated by the optical engine module 190. Furthermore, the heat pipe 193 of the third heat dissipation module 195 is directly or indirectly connected to the DMD of the optical engine module 190 to dissipate heat generated by the DMD.

In order to improve the heat dissipation effect, the projection device 100 of the embodiment further includes a plurality of system fans 176, 178. The system fans 176 are disposed in the housing 110 and arranged at the first air inlet A1 of the first side cover 116 along a direction parallel to the optical axis X, wherein the plurality of system fans 176 respectively correspond to the first heat dissipation module 150 and the second heat dissipation module 160. For example, one of the system fans 176 is disposed between the first heat dissipation module 150 and the first air inlet A1. Another of the system fans 176 is disposed between the second heat dissipation module 160 and the first air inlet A1. The system fans 178 are disposed in the housing 110 and arranged at the air outlet A3 of the second side cover 118 along a direction parallel to the optical axis X. Preferably, the system fans 178 at the air outlet A3 respectively correspond to the system fans 176 at the first air inlet A1. In addition, the projection device 100 further includes a power supply module 197 disposed in the housing 110 and located in the second area S2, wherein the power supply module 197 is located between the projection lens 120 and the air outlet A3.

This embodiment has two air flow fields. The first air flow field is: the system fans 176 drive the cold air from the first air inlet A1 at the first side cover 116 into the first area S1 of the housing 110, and through the first air guider G1 and the air guiding plate 185, the cold air flows through the first heat dissipation module 150 and then passes from below the projection lens 120 to the power supply module 197 and the third heat dissipation module 195 located on the second area S2, and then, the corresponding system fans 178 guide the hot air out of the air outlet A3 at the second side cover 118. The second air flow field is: the system fans 176, 174 drive the cold air from the first air inlet A1 at the first side cover 116 and the second air inlet A2 at the rear cover 114 into the first area S1 of the housing 110, and through the second air guider G2 and the third air guider G3, the cold air flows through the second heat dissipation module 160 to the power supply module 197 and the third heat dissipation module 195 located on the second area S2, and then, the corresponding system fans 178 guide the hot air out of the air outlet A3 at the second side cover 118.

Based on the above, the embodiments of the invention can achieve at least one of the following advantages or effects. In the design of the projection device of the invention, the direction of the optical axis of the projection lens divides the accommodation space of the housing into the first area and the second area. The first light source module, the second light source module, the first heat dissipation module and the second heat dissipation module are located in the first area, and the first air inlet disposed on the first side cover and the second air inlet disposed on the rear cover are located at the first area, and the air outlet is located at the second area. This is, the first light source module and the second light source module are adjacent to the first air inlet and the second air inlet, and the air outlet is far away from the first light source module and the second light source module, so that the heat dissipation effect of the first light source module is substantially similar as the heat dissipation effect of the second light source module. In addition, the second air inlet and the air outlet are respectively located on both side of the optical axis to prevent hot air from flowing back. In short, the projection device of the present invention can have a better heat dissipation effect.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A projection device, comprising a housing, a projection lens, a first light source module, a second light source module, a first heat dissipation module and a second heat dissipation module, wherein the housing comprises a front cover, a rear cover, a first side cover, a second side cover, a first air inlet, a second air inlet and an air outlet, wherein the front cover and the rear cover are opposite to each other, the first side cover and the second side cover are opposite to each other and connect the front cover and the rear cover, and the front cover, the rear cover, the first side cover and the second side cover define an accommodation space;

the projection lens is disposed in the housing, and a direction of an optical axis of the projection lens divides the accommodation space into a first area and a second area, wherein a light emitting side of the projection lens is located on the front cover, the first air inlet is disposed on the first side cover and located at the first area, the second air inlet is disposed on the rear cover and located at the first area, and the air outlet is disposed on the second side cover and located at the second area; and the first light source module, the second light source module, the first heat dissipation module and the second heat dissipation module are located in the first area of the accommodation space, wherein the first heat dissipation module is connected to the first light source module to dissipate heat generated by the first light source module, and the second heat dissipation module is connected to the second light source module to dissipate heat generated by the second light source module.

2. The projection device according to claim 1, wherein the first side cover and the second side cover respectively comprise a plurality of ribs, and the respective rib disposed on the second side cover is inclined respect to the second side cover for guiding an airflow outputting from the air outlet to the rear cover.

3. The projection device according to claim 1, wherein a distance between the first side cover and the second side cover is greater than a distance between the front cover and the rear cover.

4. The projection device according to claim 1, wherein the projection lens is located in the middle of the housing.

5. The projection device according to claim 1, wherein the projection lens is an ultra-short focal reflective projection lens.

6. The projection device according to claim 1, wherein each of the first light source module and the second light source module comprises at least one red light emitting diode, at least one green light emitting diode and at least one blue light emitting diode.

7. The projection device according to claim 1, wherein the first heat dissipation module comprises a first heat dissipation fin assembly, a second heat dissipation fin assembly and a heat pipe connecting the first heat dissipation fin assembly and the second heat dissipation fin assembly, and the first light source module is connected to the heat pipe.

8. The projection device according to claim 7, wherein the first heat dissipation fin assembly, the second heat dissipation fin assembly and the heat pipe are arranged in a U shape.

9. The projection device according to claim 7, further comprising:
a system fan disposed between the first heat dissipation fin assembly and the second heat dissipation fin assembly, wherein an air outlet direction of the system fan is parallel to an air inlet direction of the first air inlet.

10. The projection device according to claim 1, further comprising:
a first air guider covered on the first heat dissipation module, wherein the first air guider comprises two side walls respectively disposed on opposite sides of the first heat dissipation module along a direction perpendicular to the optical axis.

11. The projection device according to claim 1, wherein the second heat dissipation module comprises a third heat dissipation fin assembly, a forth heat dissipation fin assembly and a heat pipe connecting the third heat dissipation fin assembly and the forth heat dissipation fin assembly, the second light source module is connected to the heat pipe, the third heat dissipation fin assembly is located between the first air inlet and the second light source module, and the forth heat dissipation fin assembly is disposed near the second air inlet.

12. The projection device according to claim 11, wherein further comprising:
a system fan disposed near the second air inlet, wherein the forth heat dissipation fin assembly is located between the system fan and the second air inlet.

13. The projection device according to claim 11, further comprising:
a second air guider covered on the third heat dissipation fin assembly, wherein the second air guider comprises two side walls respectively disposed on opposite sides of the third heat dissipation fin assembly along a direction perpendicular to the optical axis; and
a third air guider covered on the forth heat dissipation fin assembly, wherein the third air guider comprises two side walls respectively disposed on opposite sides of the forth heat dissipation fin assembly along a direction parallel to the optical axis.

14. The projection device according to claim 1, further comprising:
a shielding plate disposed in the housing and located in the first area, wherein the shielding plate covers the first light source module, the second light source module, the first heat dissipation module and the second heat dissipation module; and
an air guiding plate fixed on the shielding plate and extending from the shielding plate to the projection lens, wherein the air guiding plate is located between the first heat dissipation module and the projection lens to guide an airflow flowing through the first heat dissipation module to pass under the projection lens.

15. The projection device according to claim 11, further comprising: a first air guider covered on the first heat dissipation module, a second air guider covered on the third heat dissipation fin assembly, and a third air guider covered on the forth heat dissipation fin assembly, wherein each of the first air guider, the second air guider, and the third air guider comprises two side walls and a top wall connected between the two side walls.

16. The projection device according to claim 1, further comprising:
an optical engine module disposed in the housing and connected to the projection lens, wherein the optical engine module is located between the projection lens and the rear cover; and
a third heat dissipation module disposed in the housing and located in the second area, wherein the third heat dissipation module is connected to the optical engine module to dissipate heat generated by the optical engine module.

17. The projection device according to claim 1, further comprising:
a plurality of system fans disposed in the housing and arranged at the first air inlet of the first side cover along a direction parallel to the optical axis, wherein the plurality of system fans respectively correspond to the first heat dissipation module and the second heat dissipation module.

18. The projection device according to claim 1, further comprising:
a plurality of system fans disposed in the housing and arranged at the air outlet of the second side cover along a direction parallel to the optical axis.

19. The projection device according to claim 1, further comprising:
a power supply module disposed in the housing and located in the second area, wherein the power supply module is located between the projection lens and the air outlet.

20. The projection device according to claim 1, wherein a duty cycle of the first light source module is the same as a duty cycle of the second light source module.

* * * * *